United States Patent [19]

Inasaka

[11] Patent Number: 5,373,110
[45] Date of Patent: Dec. 13, 1994

[54] MULTILAYER CIRCUIT BOARD WITH REPAIRED I/O PIN AND PROCESS FOR REPAIRING I/O PIN ON MULTILAYER CIRCUIT BOARD

[75] Inventor: Jun Inasaka, Tokyo, Japan
[73] Assignee: NEC Corporation, Tokyo, Japan
[21] Appl. No.: 958,756
[22] Filed: Oct. 9, 1992
[30] Foreign Application Priority Data
Oct. 11, 1991 [JP] Japan .................. 3-263801
[51] Int. Cl.⁵ .............................. A05K 1/00
[52] U.S. Cl. ................... 174/267; 174/259; 174/261; 361/785; 439/75; 439/82
[58] Field of Search .......... 174/256, 258, 259, 260, 174/261, 262, 265, 266, 267; 361/760, 784, 785, 791; 439/75, 78, 79, 82, 84; 228/180.1, 180.2

[56] References Cited

U.S. PATENT DOCUMENTS

| | | |
|---|---|---|
| 5,049,434 | 9/1991 | Wasulko . |
| 5,173,842 | 12/1992 | Depew . |
| 5,191,224 | 3/1993 | Tazunoki et al. . |
| 5,241,454 | 8/1993 | Ameen et al. . |

OTHER PUBLICATIONS

European Search Report for Application No. EP 92 11 7417.
Patent Abstracts of Japan, vol. 015, No. 185 (E-1066) 13 May 1991 & JP-A-30 46 780 (Fujitsu Ltd) 28 Feb. 1991.
Patent Abstracts of Japan, vol. 015, No. 486 (E-1143) 10 Dec. 1991 & JP-A-32 11 760 (Hitachi Ltd) 17 Sep. 1991.
Patent Abstracts of Japan, vol. 014, No. 225 (E-0927) 14 May 1990 & J-A-20 58 257 (NGK Spark Plug Co Ltd) 27 Feb. 1990.
Patent Abstracts of Japan, vol. 007, No. 218 (E-200) 28 Sep. 1983 & JP-A-58 110 064 (Nippon Denki KK) 30 Jun. 1983.
IBM Technical Disclosure Bulletin, vol. 25, No. 4, Sep. 1982, New York US, p. 1800, Bosley et al., "Pin Attachment To A Substrate".

*Primary Examiner*—Leo P. Picard
*Assistant Examiner*—Cheryl R. Figlin
*Attorney, Agent, or Firm*—Burns, Doane, Swecker & Mathis

[57] ABSTRACT

When an external connection I/O pin which is formed on a multilayer ceramic circuit board is broken off together with a part of a ceramic substrate, an electrically conductive adhesive is filled in the area where the I/O pin broke and was removed, and together with standing a new pin in this place and connecting it electrically, the new pin is bridged and secured to the surrounding I/O pins using a fixation plate. In so doing, it is possible to restore the broken I/O pin to have the same electrical and mechanical characteristics as before.

16 Claims, 9 Drawing Sheets

MULTILAYER CIRCUIT BOARD WITH REPAIRED I/O PIN AND PROCESS FOR REPAIRING I/O PIN ON MULTILAYER CIRCUIT BOARD

BACKGROUND OF THE INVENTION

1. Field of the Invention

This invention relates to a process for repairing I/O pins formed on a multilayer circuit board and multilayer circuit board having I/O pin or pins repaired thereby, and in more particular a process for repairing I/O pins formed on a multilayer ceramic or glass ceramics circuit board and structure of the repaired I/O pin or pins formed on the multilayer ceramic or glass ceramic circuit board.

2. Description of the Prior Art

Formerly, the multilayer ceramic circuit board on which I/O pins were formed was a single chip module pin grid array. In such a multilayer ceramic circuit board, however, when an I/O pin was broken, there was no case of repairing the I/O pin.

In a recent multi chip module, when an I/O pin was broken, the I/O pin can be sometimes repaired. However, this is limited to a case where the I/O pin itself was broken. When the I/O pin was broken together with a part of a substrate, it was impossible to repair the I/O pin.

Recently, in view of an aspect of electrical characteristics, a substrate of low strength, such as a glass ceramics substrate, has been often used as a substrate for the multi chip module. As a result, when the I/O pin was broken, a part of the substrate was often broken therewith. In such a case, however, it was impossible to properly repair the I/O pin.

In the aforementioned glass ceramics substrate, the I/O pins are very thin and so are easily damaged or broken as shown in FIG. 1 through FIG. 4.

FIG. 1 shows a case where the I/O pin 51 is broken in the shaft region, and FIG. 2 shows a case where the I/O pin 51 is broken in the region where it is brazed. Also, FIG. 3 shows a case where the I/O pin 51 and an attachment pad 52 are both peeled off from a ceramic substrate 53 and broken, and FIG. 4 shows a case where the ceramic substrate 53 is broken together with the I/O pin 51.

In the prior multilayer circuit board, when an I/O pin was broken, the I/O pin could not be repaired, and the entire multilayer circuit board had to be replaced.

Therefore, for electronic devices which use multi chip module type added-value circuit boards, there is a problem of high repair costs.

SUMMARY OF THE INVENTION

An object of this invention is to provide a process for repairing I/O pin or pins on a multilayer circuit board such as a multilayer ceramic circuit board when an I/O pin or pins is broken together with an attachment pad or when an I/O pin or pins is broken together with a part of a substrate such as a ceramic substrate.

Another object of this invention is to provide a multilayer circuit board with repaired pin or pins according to the above process.

According to one aspect of this invention, there is provided a multilayer circuit board with a repaired I/O pin, comprising a new I/O pin adhered to the location on the multilayer circuit board where an broken I/O pin was removed, and a fixation plate for bridging and securing the new I/O pin to I/O pins surrounding the new I/O pin.

According to another aspect of this invention, there is provided a process for repairing an I/O pin on a multilayer circuit board, comprising the steps of a first step of attaching and adhering a new I/O pin to a location on the multilayer circuit board where an broken I/O pin was removed and a second step of bridging and securing said new I/O pin to surrounding I/O pins with a fixation plate.

DESCRIPTION OF THE PREFERRED EMBODIMENTS

Figure 1:
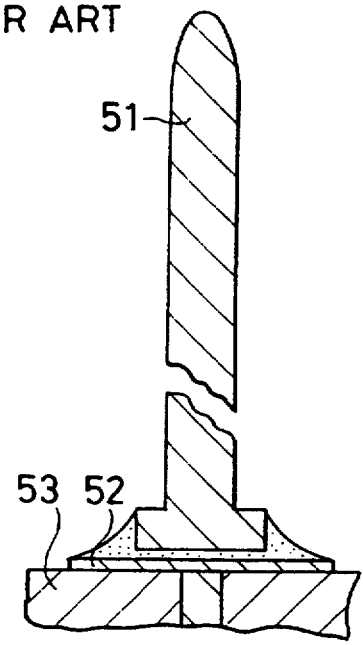
FIG. 1 is a cross-sectional view describing the condition of a broken I/O pin of a prior multilayer circuit board.
Figure 2:
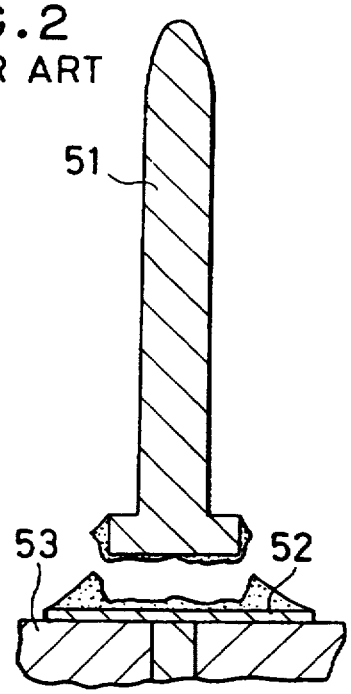
FIG. 2 is a cross-sectional view describing the condition of a broken I/O pin of a prior multilayer circuit board.
Figure 3:
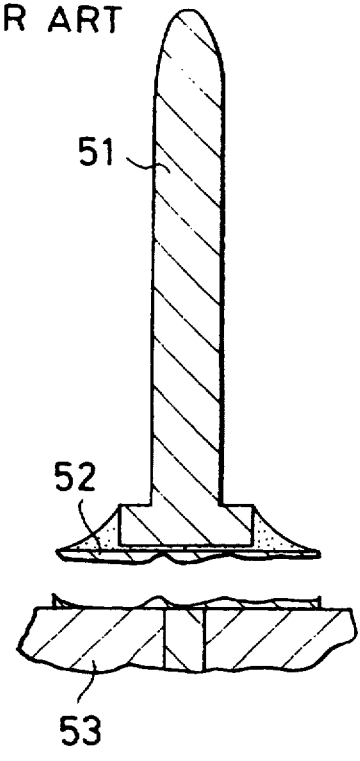
FIG. 3 is a cross-sectional view describing the condition of a broken I/O pin of a prior multilayer circuit board.
Figure 4:
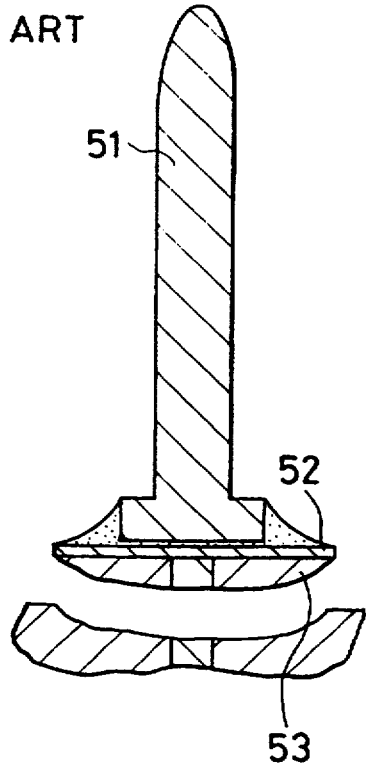
FIG. 4 is a cross-sectional view describing the condition of a broken I/O pin of a prior multilayer circuit board.

Next, this invention will be described in reference to the drawings. The same allocated reference numerals in the drawings show the same elements throughout the drawings.

Figure 5:
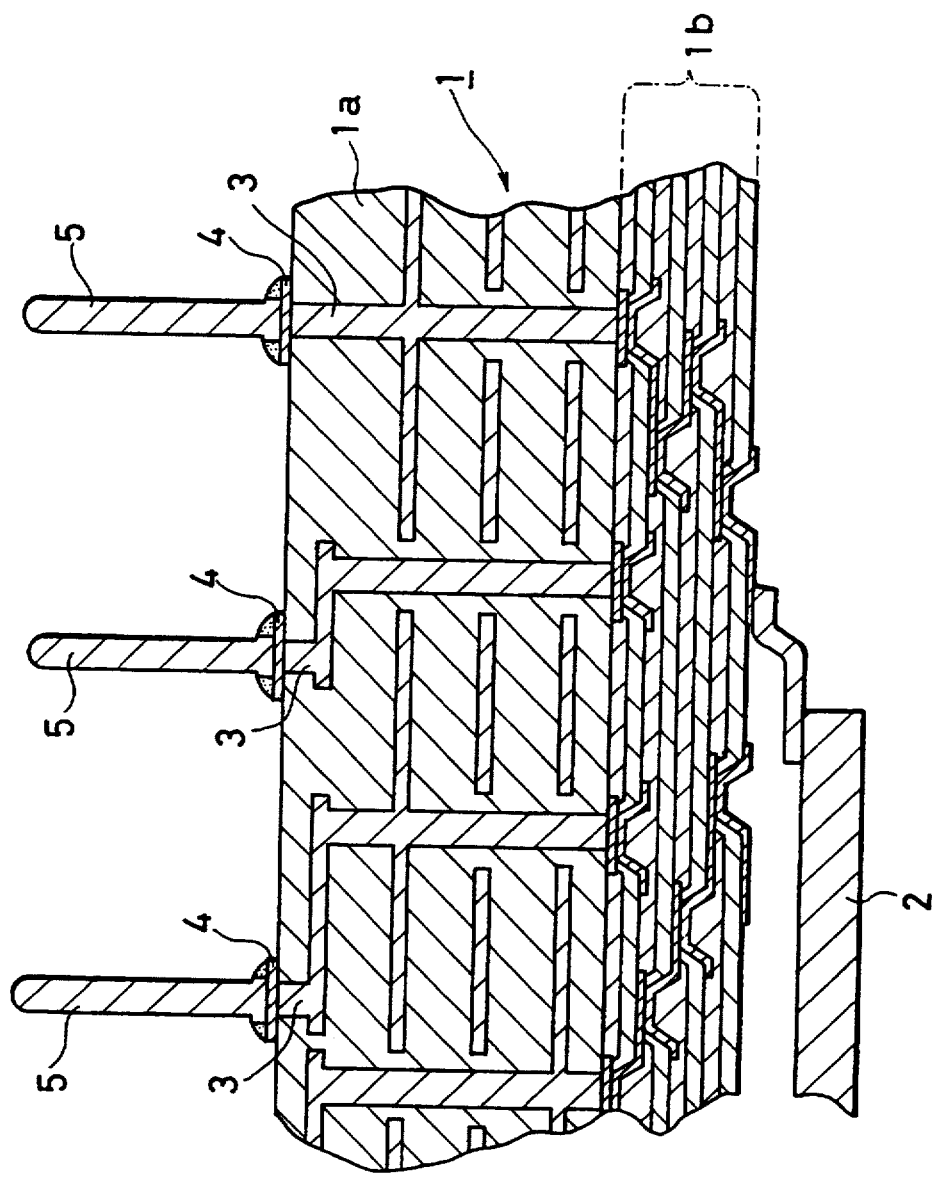
FIG. 5 is a partially cross-sectional view of an embodiment of a normal multilayer circuit board.

Before describing this invention, the construction of a normal multilayer circuit board with no broken I/O pins as shown in FIG. 5 will be described as follows.

In FIG. 5, the multilayer circuit board 1 comprises a ceramic substrate 1a, and very thin film metal layers 1b formed on the surface of this ceramic substrate 1a with polyimide as an insulator or insulation film between layers. An LSI chip is mounted on top of the thin film metal layers 1b.

Several through holes 3 are formed in the ceramic substrate 1a and attachment pads 4 are located on the rear surface of the ceramic substrate 1a corresponding to the respective through holes 3. To each of the attachment pads 4, I/O pins 5 used for external connection are brazed, and are electrically connected to the LSI chip 2 by way of the through holes 3 in the ceramic substrate 1a.

For example, the diameter of the through holes 3 can be set to be 0.25 mm, and the inside of the holes can be filled with conducting paste such as tungsten, molybdenum, gold, silver, silver-palladium or the like. The diameter of the attachment pads 4 can be set to be 1.3 mm and the pads 4 can be made of a sputtering film such as a gold plating film, copper plating film, thick gold film, thick copper film or palladium film, or the like.

The I/O pins have, for instance, a diameter of 0.35 mm and a length of 5.00 mm. The ends of the I/O pins 5 which adhere to the attachment pads 4 are subjected to a header process to have an increased surface area and thus obtain sufficient adhesive strength, and the surface of the pins is covered with a gold plating. A brazing material used to braze the I/O pins 5 to the attachment pads 4 generally includes a eutectic crystal alloy brazing material such as gold/tin of 80/20 (wt. %), or silver/copper of 72/28 (wt. %).

Figure 6:
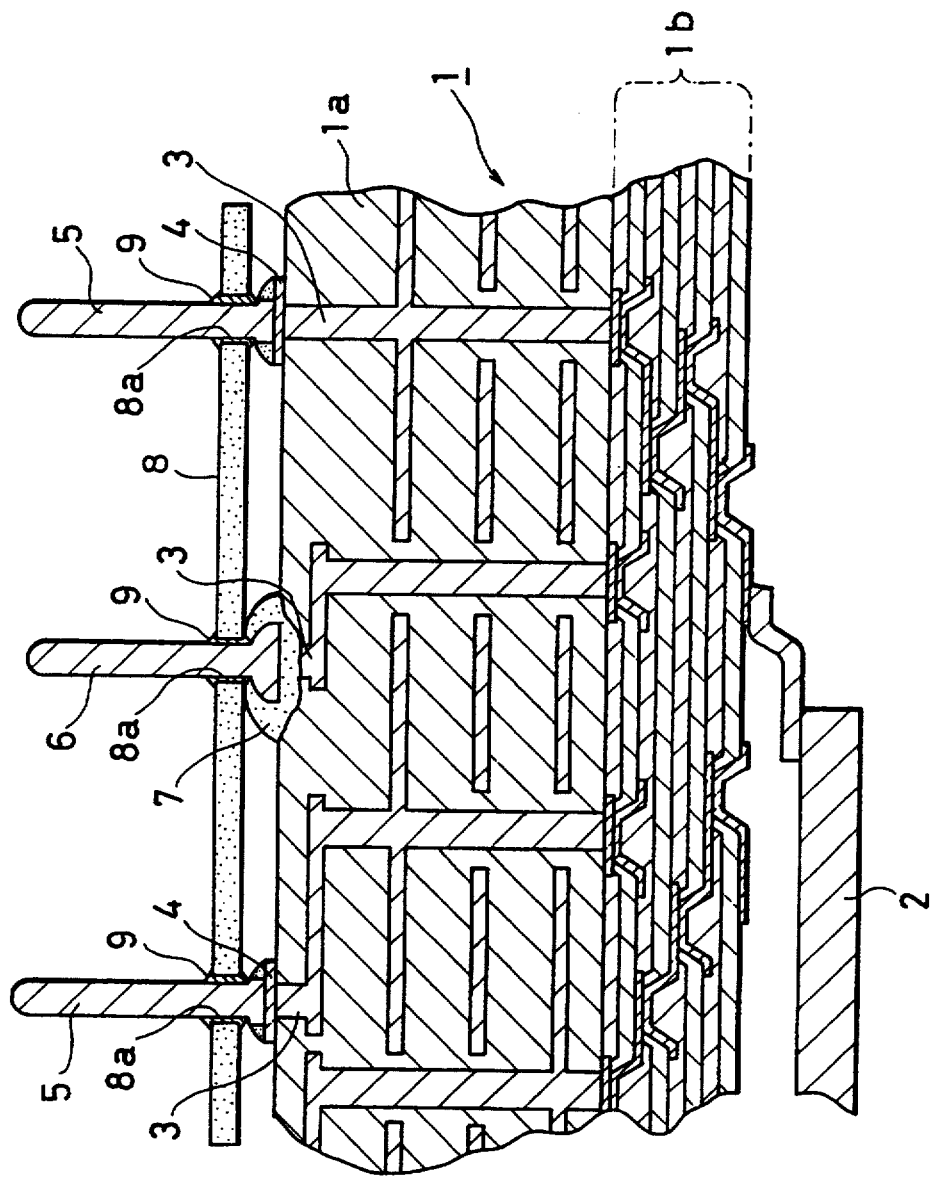
FIG. 6 is a partially cross-sectional view showing a multilayer circuit board with a repaired I/O pin according to an embodiment of this invention.

FIG. 6 shows a construction of a multilayer circuit board with a repaired I/O pin for a case when an I/O pin of I/O pins 5 formed on the rear surface of the ceramic substrate 1a has broken together with the attachment pad 4, or when it has broken together with a part of the ceramic substrate 1a.

In the location of the broken I/O pin, a new I/O pin 6 (repair pin, or pin for repairing the broken location) is secured to the rear surface of the ceramic substrate 1a using an electrically conductive adhesive 7. Also, the repair pin 6 is bridged to the surrounding I/O pins 5 using a fixation plate 8 with holes 8a in which the pins 5 and 6 are placed erect, and each of the I/O pins 5 and 6 are supported by securing them to the fixation plate 8 using adhesive 9.

The embodiment of the repairing process according to this invention will be explained in more detail with reference to FIG. 7 through FIG. 9.

Figure 7:
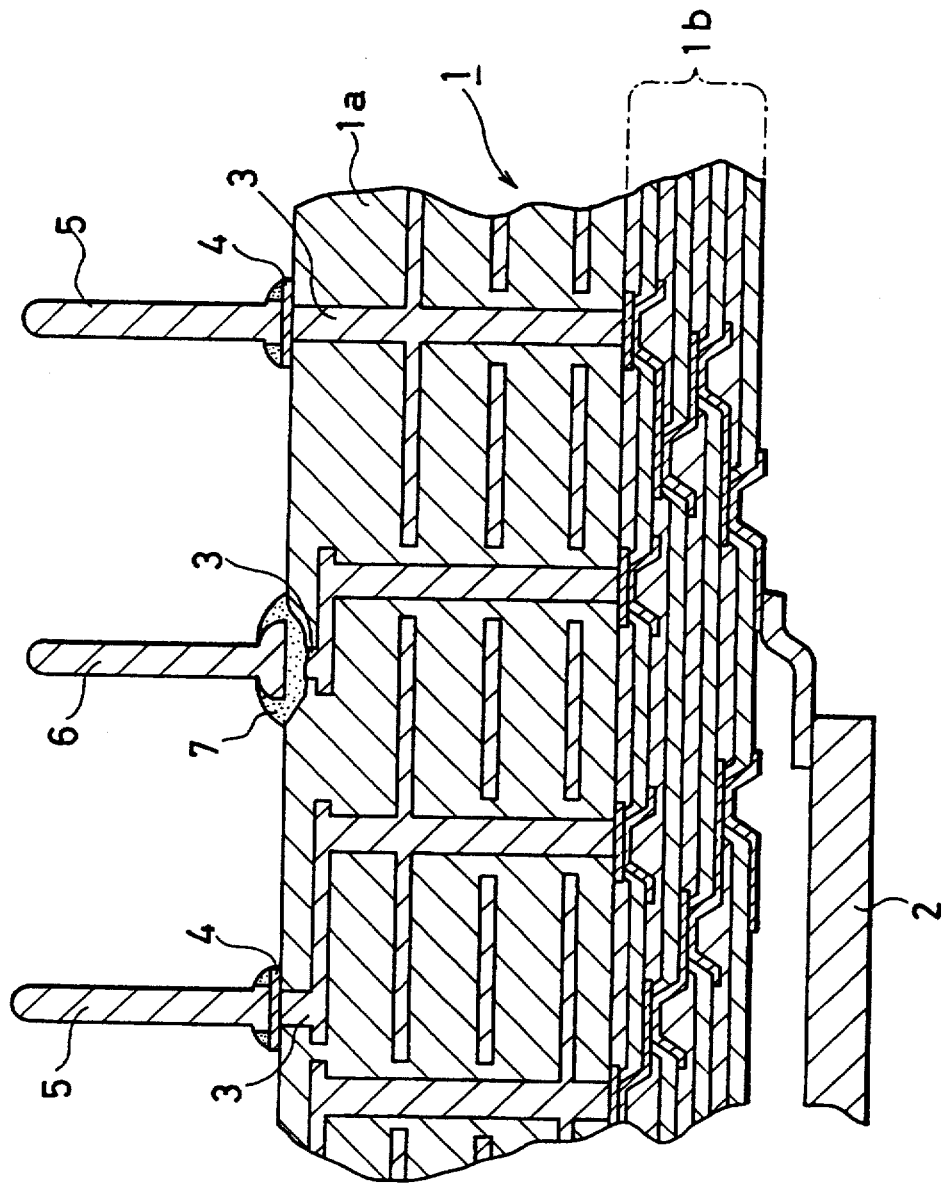
FIG. 7 is a partially cross-sectional view describing the repair process of the multilayer circuit board of an embodiment of this invention.

First, as shown in FIG. 7, the conductive adhesive 7 is filled in where the broken I/O pin was located, and the repair pin 6 is placed erect in this conductive adhesive 7 and is adhered to the location. At this time, the location where the repair pin 6 is to be placed erect is deduced from the measured dimensions from the surrounding I/O pins 5 to the location. The conductive adhesive 7 used to adhere the repair pin 6 is made of, for instance, gold-polyimide, silver-epoxy or the like. By adhering the repair pin 6 to the location of the broken I/O pin using the conductive adhesive 7, it is possible to repair the multilayer circuit board 1.

However, by only adhering the repair pin 6 to the ceramic substrate 1a using conductive adhesive 7, it is difficult to solidly secure the repair pin 6 to the ceramic substrate 1a.

Figure 8:
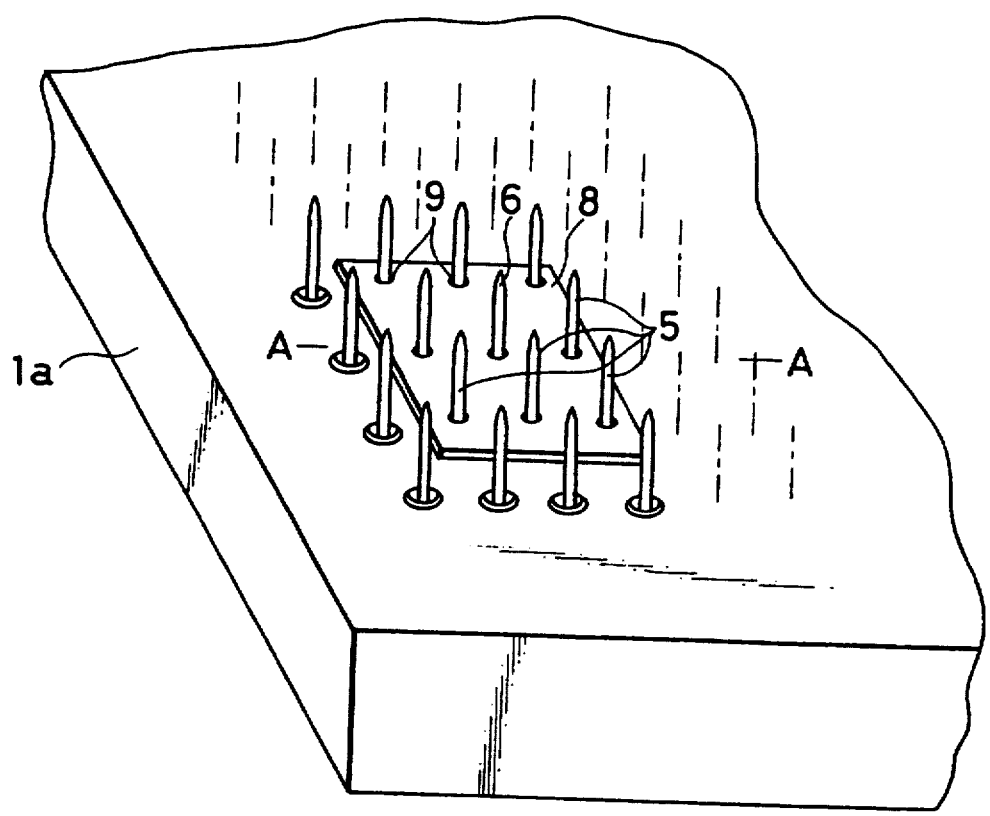
FIG. 8 is a partially oblique view describing the repair process of the multilayer circuit board of an embodiment of this invention.

Therefore, as shown in the oblique view of FIG. 8, the repair pin 6 is bridged to the surrounding I/O pins 5 joined to the ceramic substrate 1a using a fixation plate 8, and the I/O pins 5 and the repair pin 6 are adhered to the fixation plate 8 using an adhesive 9 and thus the repair pin 6 is supported by the surrounding I/O pins 5 by way of the fixation plate 8.

In this embodiment of the invention, the fixation plate 8 is a 0.635 mm thick ceramic plate, and there are nine holes 8a with a diameter of 0.4 mm formed in this fixation plate 8 having the same pitch as the surrounding I/O pins 5 and the new pin 6. The diameter of these holes 8a is regulated by the precision of the location when placing the repair pin 6 erect, however, it is desired that it is about 0.1 mm larger than the diameter of the surrounding I/O pins 5 and the repair pin 6.

Also, it is possible to use a type of epoxy or a type of ceramics as the adhesive 9, and it is desired that this adhesive 9 be filled in between each of the pins 5 and 6 and each of the holes 8a.

Figure 9:
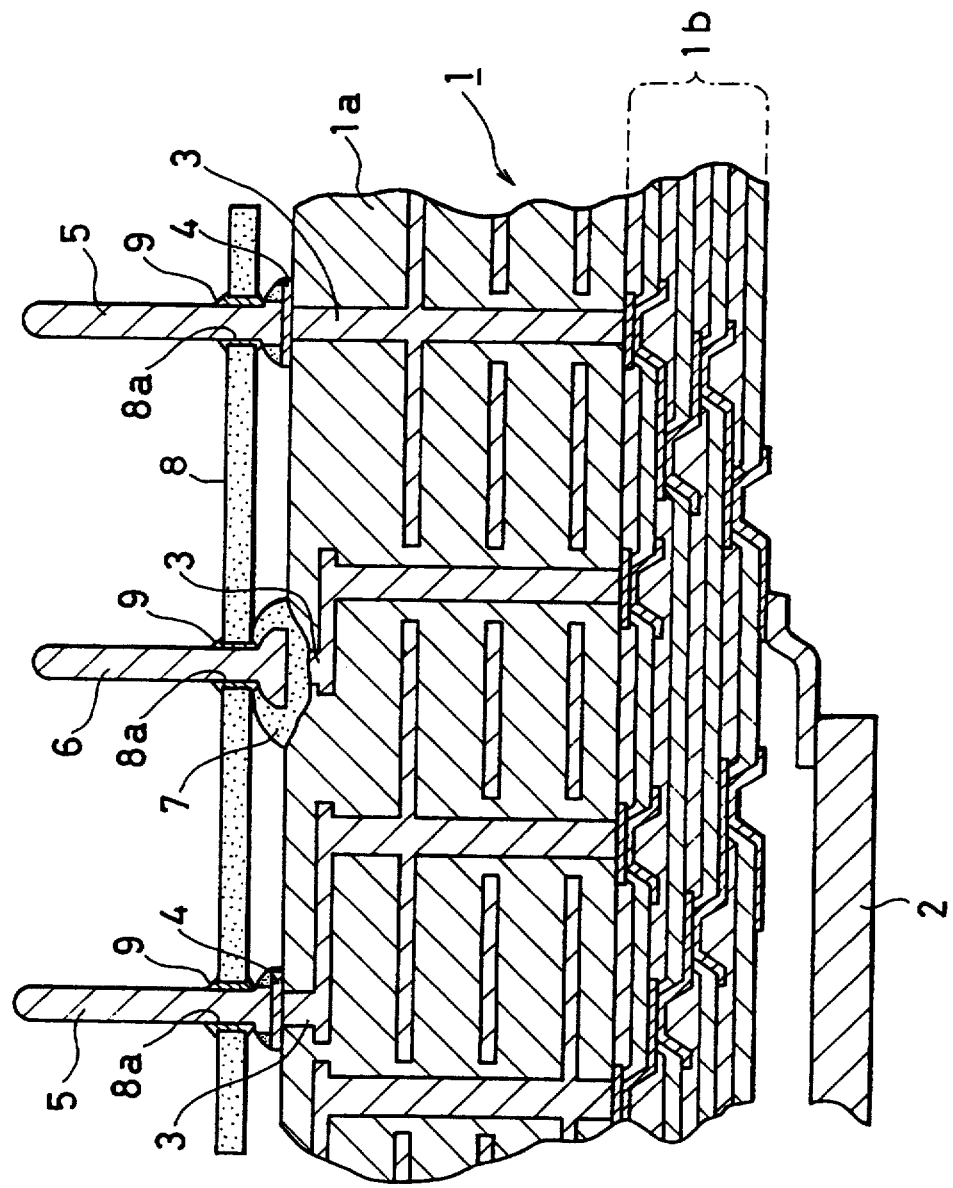
FIG. 9 is a partially cross-sectional view describing the repair process of the multilayer circuit board of an embodiment of this invention.

FIG. 9 is a cross-sectional view taken along a line A—A of FIG. 8. As shown in the figure, the adhesive 9 is filled in between each of the holes 8a formed in the fixation plate 8 and each of the surrounding I/O pins 5 and repair pin 6, and the fixation plate 8 is placed at the base of each pin 5, 6. By placing the fixation plate 8 at or near the base of each pin 5, 6, it is possible to make sure that the pins 5 and 6 are solidly secured.

Figure 10:
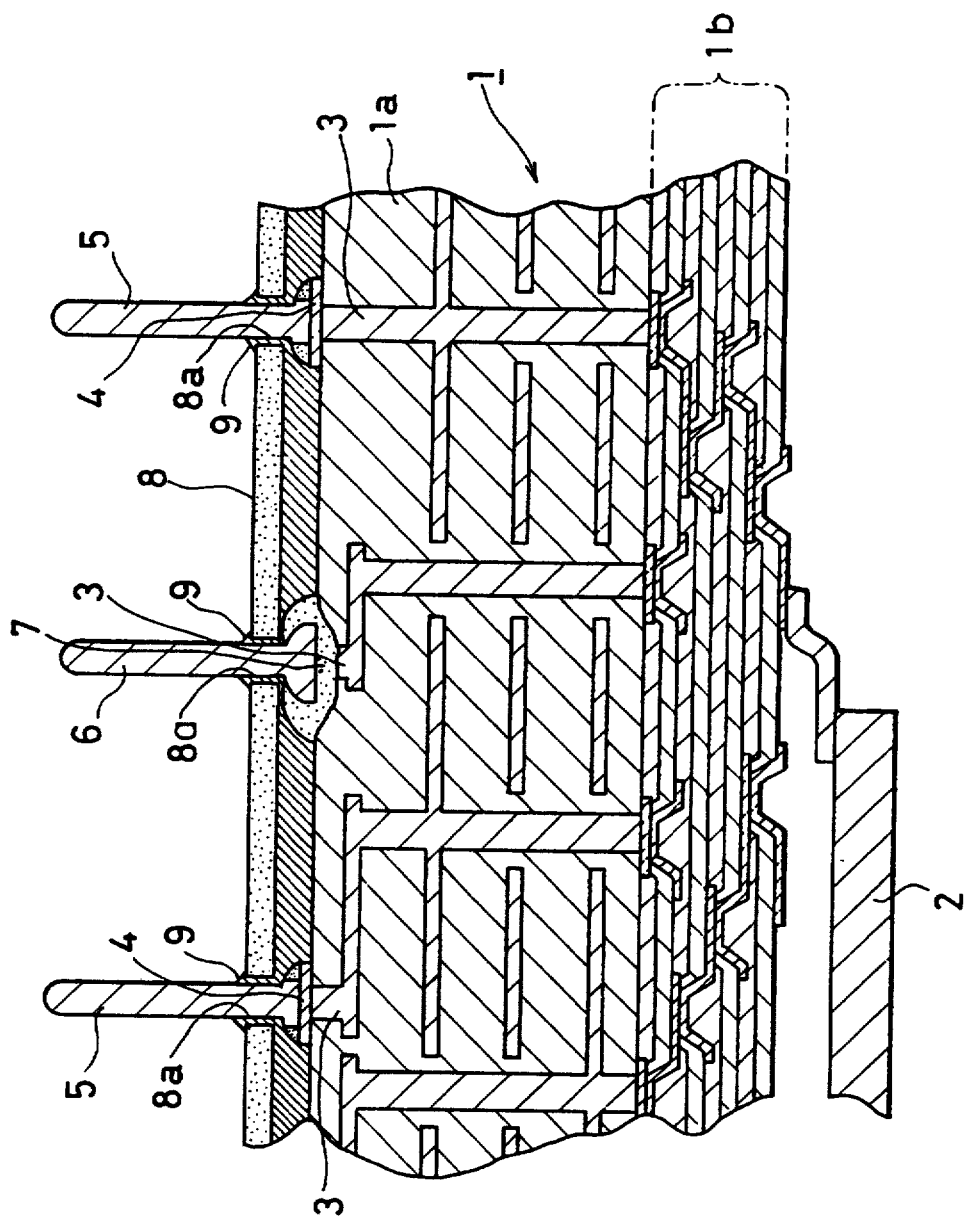
FIG. 10 is a partially cross-sectional view describing another repair process of the multilayer circuit board of an embodiment of this invention.

Referring now to FIG. 10, the adhesive 9 is completely filled in between each of the holes 8a formed in the fixation plate 8a and each of the surrounding I/O pins 5 and repair pin 6 and in a space between the rear surface of the ceramic substrate 1a and the fixation plate 8, the space including the header portion of the surrounding I/O pins 5 and repair pin 6, and the pins are adhered to the fixation plate 8.

In this case, in order that migration of adjacent pins 5, 6 does not occur inside the adhesive 9, it is desired that an adhesive 9 be selected which is superior in migration resistance.

Figure 11:
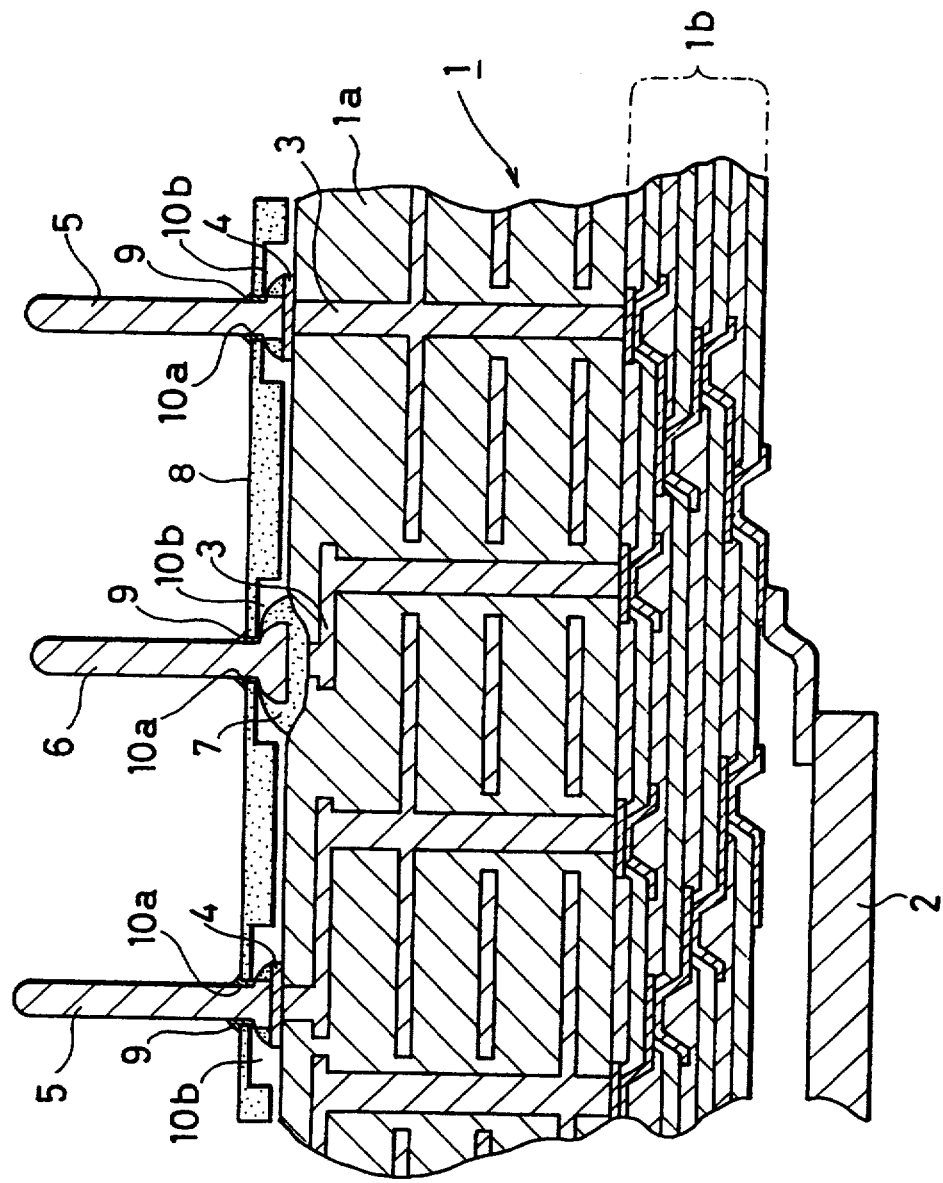
FIG. 11 is a partially cross-sectional view describing even another repair process of the multilayer circuit board of an embodiment of this invention.

FIG. 11 is a cross-sectional view of a construction of a multilayer circuit board with a repaired pin wherein, together with forming nine holes 10a having the same pitch as the surrounding I/O pins 5 and the repair pin 6, concave sections 10b are formed in a fixation plate 10 in locations corresponding to the header section of the pins 5 and 6.

The material and thickness of the fixation plate 10 are the same as those of the fixation plate 8 of the embodiments mentioned above.

In this case, it is possible for the fixation plate 10 to come in approximately or satisfactorily direct contact with the rear surface of the ceramic substrate 1a, making it possible for the pins 5 and 6 to protrude further out from the fixation plate 10, i.e. pin extension out of the fixation plate 10 being able to become longer.

Figure 12:
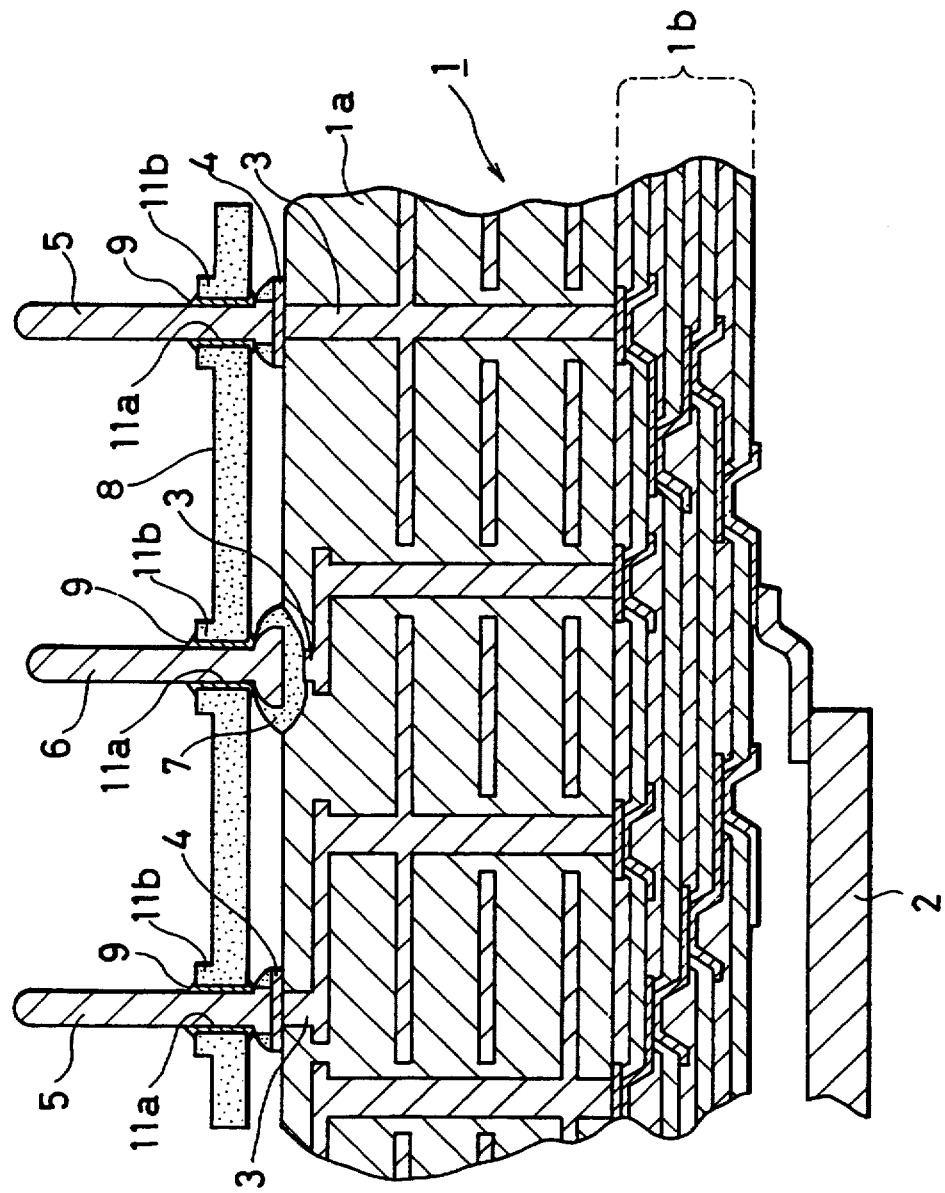
FIG. 12 is a partially cross-sectional view describing yet another repair process of the multilayer circuit board of an embodiment of this invention.

FIG. 12 is a cross-sectional view of a construction of a multilayer circuit board with a repaired pin wherein, together with forming nine holes 11a having the same pitch as the surrounding I/O pins 5 and the repair pin 6, projections (e.g. boss) 11b are formed around the holes 11a, respectively, in a fixation plate 11.

The material and thickness of the fixation plate 11 are the same as those of the fixation plates 8 and 10 mentioned above.

In this case, it is possible to lengthen the contact length of the pins 5, 6 with the fixation plate 11, i.e. the holes 11a, making it possible to more solidly secure the repair pin 6.

In each of the aforementioned embodiments, a ceramic plate was used as the fixation plates 8, 10 and 11, however, the plate is not limited to this material. It is also possible to use other materials which have superior electrical insulating properties, which are strong, and which are superior in thermal resistance. Also, the number of holes 8a, 10a, 11a formed in the fixation plates 8, 10, 11 is not limited to nine; any number can be selected as long as the repair pin is solidly supported.

Recently, in view of an aspect of electrical characteristics, a substrate of low strength such as a glass ceramics substrate must be often selected for a multilayer circuit board and thus, when an I/O pin or pins breaks, a part of the substrate often breaks or is tore out together with the pin. In such a case, a process for repairing the broken I/O pin or pins according to this invention is very important.

As described above, this invention makes it possible to repair a multilayer circuit board with a ceramics or glass ceramics substrate when I/O pins used for external connection of the multilayer circuit board break, even if this breakage causes a part of the substrate to break off as well. Therefore, it is not necessary to replace the expensive multilayer circuit board but rather electronic devices can be repaired.

While this invention has been particularly described with reference to the preferred embodiments thereof, it will be understood by those skilled in the art that the foregoing and other changes in form and details may be made therein without departing from the spirit and scope of the invention.

What is claimed is:

1. A multilayer circuit board having a plurality of I/O pins standing thereon, said multilayer circuit board comprising:
   a new I/O pin adhered to the board at the location where a broken I/O pin used to be positioned;
   a fixation plate for bridging said new I/O pin with I/O pins surrounding said new I/O pin; and
   an adhesive filling a space between said fixation plate and the board.

2. A multilayer circuit board having a plurality of I/O pins standing thereon, said multilayer circuit board comprising:
   a new I/O pin adhered to the board at the location where a broken I/O pin used to be positioned; and
   a fixation plate for bridging said new I/O pin with I/O pins surrounding said new I/O pin, said fixation plate being provided with through holes into which said I/O pins are to be inserted, said fixation plate being provided further with concave sections opening to a bottom surface of said fixation plate, said concave sections being located so that said concave sections embrace bottom ends of said I/O pins, whereby said fixation plate comes in approximately direct contact with the board and said I/O pins extend out of said fixation plate.

3. A multilayer circuit board having a plurality of I/O pins standing thereon, said multilayer circuit board comprising:
   a new I/O pin adhered to the board at the location where a broken I/O pin used to be positioned; and
   a fixation plate for bridging said new I/O pin with I/O pins surrounding said new I/O pin, said fixation plate being provided with through holes into which said I/O pins are to be inserted, said fixation plate being provided further with a protrusion extending around and along said through hole from an upper surface of said fixation plate to thereby lengthen contact length of each of said new I/O pin and said surrounding I/O pins with said through hole.

4. A multilayer circuit board as defined in claim 1, wherein said fixation plate is provided with through holes into which said I/O pins are to be inserted, said fixation plate being provided further with concave sections opening to a bottom surface of said fixation plate, said concave sections being located so that said concave sections embrace bottom ends of said I/O pins, whereby said fixation plate comes in approximately direct contact with the board.

5. A multilayer circuit board as defined in claim 1, wherein said fixation plate is provided with through holes into which said I/O pins are to be inserted, said fixation plate being provided further with protrusions extending around and along said through holes from an upper surface of said fixation plate to thereby lengthen contact length of each of said new I/O pin and said surrounding I/O pins with said through holes.

6. A multilayer circuit board as defined in claim 2, said fixation plate is provided further with protrusions extending around and along said through holes from an upper surface of said fixation plate to thereby lengthen a contact length of each of said new I/O pin and said surrounding I/O pins with said through holes.

7. A multilayer circuit board as defined in claim 1, wherein said new I/O pin is adhered to the board by means of an electrically conductive adhesive.

8. A multilayer circuit board as defined in claim 7, wherein said adhesive is made of one of gold-polyimide and silver-epoxy.

9. A process for repairing an I/O pin arrangement including a plurality of I/O pins standing on a multilayer circuit board, comprising the steps of:
   removing a broken I/O pin from the board;
   adhering a new I/O pin to the board at the location where said broken I/O pin used to be positioned;
   bridging said new I/O pin with surrounding I/O pins by means of a fixation plate, said fixation plate being provided with through holes into which said I/O pins are to be inserted; and
   filling adhesive in a space between said fixation plate and the board.

10. A process for repairing an I/O pin arrangement including a plurality of I/O pins standing on a multilayer circuit board, comprising the steps of:
    removing a broken I/O pin from the board;
    adhering a new I/O pin to the board at the location where said broken I/O pin used to be positioned; and
    bridging said new I/O pin with surrounding I/O pins by means of a fixation plate, said fixation plate being provided with through holes into which said I/O pins are to be inserted, said fixation plate being provided further with concave sections opening to a bottom surface of said fixation plate, said concave sections being located so that said concave sections embrace bottom ends of said I/O pins, whereby said fixation plate comes in approximately direct contact with the board.

11. A process for repairing an I/O pin arrangement including a plurality of I/O pins standing on a multilayer circuit board, comprising the steps of:
    removing a broken I/O pin from the board;
    adhering a new I/O pin to the board at the location where said broken I/O pin used to be positioned; and
    bridging said new I/O pin with surrounding I/O pins by means of a fixation plate, said fixation plate being provided with through holes into which said I/O pins are to be inserted, said fixation plate being provided further with protrusions extending around and along said through holes from an upper surface of said fixation plate to thereby lengthen a contact length of each of said new I/O pin and said surrounding I/O pins with said through holes.

12. A process as defined in claim 9, wherein said fixation plate is provided with through holes into which said I/O pins are to be inserted, said fixation plate being provided further with concave sections opening to a bottom surface of said fixation plate, said concave sections being located so that said concave sections embrace bottom ends of said I/O pins, whereby said fixation plate comes in approximately direct contact with the board.

13. A process as defined in claim 9, wherein said fixation plate is provided with through holes into which said I/O pins are to be inserted, said fixation plate being provided further with protrusions extending around and along said through holes from an upper surface of said fixation plate to thereby lengthen contact length of each of said new I/O pin and said surrounding I/O pins with said through holes.

14. A process as defined in claim 10, said fixation plate is provided further with protrusions extending around and along said through holes from an upper surface of said fixation plate to thereby lengthen contact length of each of said new I/O pin and said surrounding I/O pins with said through holes.

15. A process as defined in claim 9, wherein said new I/O pin is adhered to the board by means of an electrically conductive adhesive.

16. A process as defined in claim 15, wherein said adhesive is made of one of gold-polyimide and silver-epoxy.

* * * * *